United States Patent
Chen et al.

(10) Patent No.: US 7,292,176 B1
(45) Date of Patent: Nov. 6, 2007

(54) DELAY LINE, ANALOG-TO-DIGITAL CONVERTING DEVICE AND LOAD-SENSING CIRCUIT USING THE SAME

(75) Inventors: Ke-Horng Chen, Taipei County (TW); Li-Ren Huang, Taipei County (TW); Hong-Wei Huang, Taichung County (TW); Sy-Yen Kuo, Taipei (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 11/457,973

(22) Filed: Jul. 17, 2006

(30) Foreign Application Priority Data

Apr. 24, 2006 (TW) ............................ 95114513 A

(51) Int. Cl.
*H03M 1/60* (2006.01)
(52) U.S. Cl. .................. 341/157; 324/617; 713/401
(58) Field of Classification Search ................ 341/155, 341/135, 136, 157, 122; 324/617; 713/401
See application file for complete search history.

(56) References Cited

U.S. PATENT DOCUMENTS 6,243,784 B1 * 6/2001 Anderson et al. ........... 713/401
6,570,456 B2 * 5/2003 Mano et al. ................... 331/11
6,697,002 B2 * 2/2004 Sekiya et al. ............... 341/143
7,196,526 B2 * 3/2007 Vincent et al. ............. 324/617

* cited by examiner

Primary Examiner—Peguy JeanPierre
(74) Attorney, Agent, or Firm—J.C. Patents

(57) ABSTRACT

A delay line, an analog-to-digital converting device and a load-sensing circuit using the same are provided. The delay line comprises a delay-control terminal, a reset terminal, and n delay cells $DCELL_x$ ($0 < x \leq n$). The delay cells $DCELL_1$~$DCELL_n$ are connected in series to each other. Each of the delay cells $DCELL_x$ is coupled to the delay-control terminal and the reset terminal for transmitting the first level stage by stage between the delay cells according to a delay time decided by the delay-control terminal in a sensing period. The outputs of all delay cells are reset to the second level when the sensing period is finished. The sensing period is decided by the signal from the reset terminal. Wherein, at least an output terminal $t_y$ ($0 < y \leq n$) of a delay cell $DCELL_y$ among the delay cells $DCELL_1$~$DCELL_n$ used as output terminal of the delay line.

17 Claims, 7 Drawing Sheets

DELAY LINE, ANALOG-TO-DIGITAL CONVERTING DEVICE AND LOAD-SENSING CIRCUIT USING THE SAME

CROSS-REFERENCE TO RELATED APPLICATION

This application claims the priority benefit of Taiwan application serial no. 95114513, filed on Apr. 24, 2006. All disclosure of the Taiwan application is incorporated herein by reference.

BACKGROUND OF THE INVENTION

1. Field of Invention

The present invention relates to a delay line. More particularly, the present invention relates to a delay line that transmits the first level stage by stage according to a delay time decided by the sensing period, and reset to the second level when the sensing period is finished, and an analog-to-digital converting device and a load-sensing circuit using the same.

2. Description of Related Art

Signal converting circuits are essential to electronic products that require data communication and image processing, even through we are now entering the system-on-chip (SOC) era. FIG. 1 is a circuit diagram of a common delay circuit. If a conventional delay circuit is applied to a signal converting circuit, as common delay circuits mainly adopt the voltage-control mode, that is, the input voltage $V_{in}$ to be converted into digital codes is taken as the supply voltage in the delay circuit, thus the delay difference in signal transmission will occur. However, as the voltage swing of the output signal of each of the delay cells is $0 \sim V_{in}$, logic operation errors may occur at the back end decoder due to the difference between the voltage and the supply voltage of the decoder. In order to solve the problem, a level shifter is added to mediate and convert the voltage levels of the signals of the delay circuit and the decoder to be the same, such that the correct logic operation can be performed. If the error value of the trigger time of the delay signal to be processed is quite critical, the level shifter should be fast. Thus, the signal processing becomes complicated, and the power consumption increases as well.

Furthermore, in order to improve the service lifetime of the product and the battery, the power consumption of the converting circuit and whether quick sensing and code conversion can be achieved become very important indices. FIG. 2 is a circuit diagram of a conventional signal converting circuit. A conventional signal converting circuit (e.g., an analog-to-digital converter) usually uses a large quantity of comparators CP and resistors R. A plurality of resistors R is connected in series to form a voltage divider, so as to further provide reference voltages at different levels to corresponding comparators CP. Each of the comparators compares the input voltage $V_{in}$ that is to be converted into digital codes and the corresponding reference voltage, and the comparators CP thus output digital codes corresponding to the input voltage $V_{in}$. However, the number of comparators CP required will increase when the bit number of the digital codes to be generated is increased, thus aggravating the power consumption problem.

SUMMARY OF THE INVENTION

One objective of the present invention is to provide a delay line to transmit the first level stage by stage between delay cells according to the decided delay time in a sensing period, and reset the outputs of the delay cells to the second level when the sensing period is finished.

Another objective of the present invention is to provide a load-sensing circuit to convert the load information related to the load into control signals so as to control the power supplier by using the time delay technology.

Still another objective of the present invention is to provide an analog-to-digital converting device to convert the analog voltage into digital codes by using the time delay technology, such that low power consumption can be achieved, high precision irrelevant to temperature can be maintained, and thus the performance of the analog-to-digital converter is significantly improved.

To achieve the aforementioned objectives, the present invention provides a delay line, which comprises a delay-control terminal, a reset terminal, and n delay cells $DCELL_x$. $DCELL_x$ is the $x^{th}$ delay cell ($0 < x \leq n$), and the delay cells $DCELL_1 \sim DCELL_n$ are connected in series to each other. Each of the delay cells $DCELL_x$ is coupled to the delay-control terminal and the rest terminal for transmitting the first level stage by stage between the delay cells according to a delay time decided by the delay-control terminal in a sensing period. The outputs of all delay cells are reset to the second level when the sensing period is finished. The sensing period is decided by the signal from the resent terminal. Wherein, at least an output terminal $t_y$ ($0 < y \leq n$) of delay cell $DCELL_y$ among the delay cells $DCELL_1 \sim DCELL_n$ used as output terminal of the delay line.

The present invention also provides a load-sensing circuit, which comprises a delay line, a sampling unit, and a voltage-current converter. The load-sensing circuit samples the load information in every sensing period, and converts the sampling result into control signals. The delay line comprises a delay-control terminal, a reset terminal, and n delay cells $DCELL_x$. The delay cells $DCELL_1 \sim DCELL_n$ are connected in series. Each of the delay cells $DCELL_x$ is coupled to the delay-control terminal and the reset terminal for transmitting the first level stage by stage between the delay cells according to a delay time decided by the delay-control terminal in a sensing period. The output of each of the delay cells is reset to the second level when the sensing period is finished. The sensing period is decided by the signal from the reset terminal. Wherein, at least one output terminal $t_y$ ($0 < y \leq n$) of delay cell $DCELL_y$ among the delay cells $DCELL_1 \sim DCELL_n$ for providing the control signal. The sampling unit samples the load information when the sensing period starts. The voltage-current converter is coupled to the output of the sampling unit and the delay-control terminal of the delay line. The voltage-current converter converts the sampling result of the sampling unit and outputs the converted result, in which the converted result decides the delay time of the delay line. The output terminal $t_y$ of the delay line can serve as the control signal of the power supply device.

The present invention further provides an analog-to-digital converting device, which comprises a delay line, a sampling unit, a voltage-current converter, and a latch unit. The analog-to-digital converting device samples the analog signals in every sensing period, and converts the sampling result into digital codes.

The delay line comprises a control terminal, a reset terminal, and n delay cells $DCELL_x$. The delay cells $DCELL_1 \sim DCELL_n$ are connected in series. Each of the delay cells $DCELL_x$ is coupled to the delay-control terminal and the reset terminal for transmitting the first level stage by stage between the delay cells according to a delay time decided by the delay-control terminal in a sensing period. The output of each of the delay cells is reset to the second level when the sensing period is finished. The sensing period is decided by the signal from the reset terminal. Wherein at least one output terminal $t_y$ of delay cell $DCELL_y$ among the delay cells $DCELL_1 \sim DCELL_n$ used as output terminal of the delay line. The sampling unit samples the analog signals when the sensing period starts. The voltage-current converter is coupled to the output of the sampling unit and the delay-control terminal of the delay line, so as to convert the sampling result of the sampling unit and output the converted result, in which the converted result decides the delay time of the delay line. The latch unit is coupled to the output terminal $t_y$ of delay cell $DCELL_y$ of the delay line, so as to latch the signal from the output terminal $t_y$ according to the trigger of the sampling pulse to output the digital codes.

Compared with the conventional method that distinguishes the voltages by the comparators, the present invention uses the delay line to convert the electrical signal into the delay time, so as to obtain the corresponding digital codes. As no extra power is consumed after the inverter in the delay line finished signal transmission, compared with the continuous power consumption of the comparators, the delay line of the present invention has an advantage of low power consumption, and high precision irrelevant to temperature can be maintained, thereby significantly improving the performance of the analog-to-digital converter.

In order to make the aforementioned and other objectives, features and advantages of the present invention comprehensible, preferred embodiments accompanied with figures are described in detail below.

DESCRIPTION OF EMBODIMENTS

Here, the buck DC converter is taken as an example to illustrate the delay line of the present invention applied in a power supply device according to the embodiment. Those skilled in the art can implement the present invention by various types of devices within the spirit of the present invention.

In the aspect of application, loads (such as processor, RAMs, and monitors) are not always in a full-load stage, especially for mobile communication devices, which are in a standby power-saving mode in most of the time. Therefore, in practice, it is very important to keep the power supply device with optimized efficiency in all load ranges.

Figure 1:
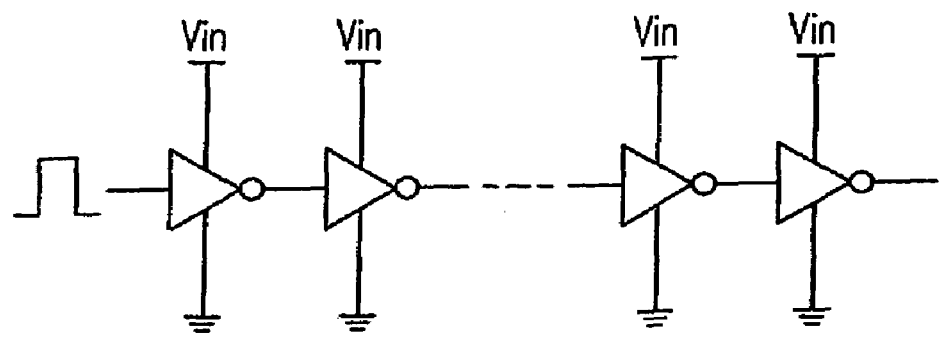
FIG. 1 is a circuit diagram of a common delay circuit.
Figure 2:
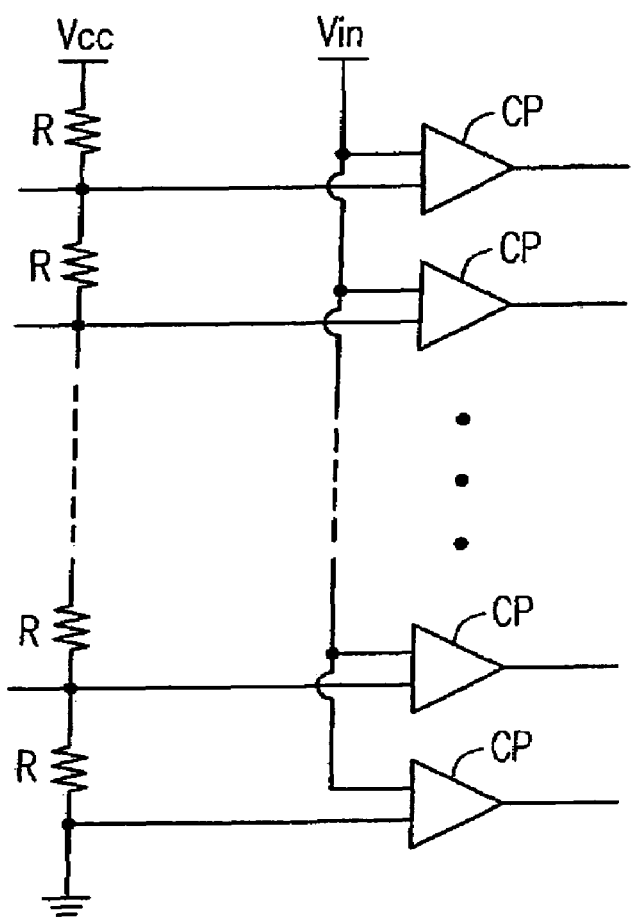
FIG. 2 is a circuit diagram of a conventional signal converting circuit.
Figure 3:
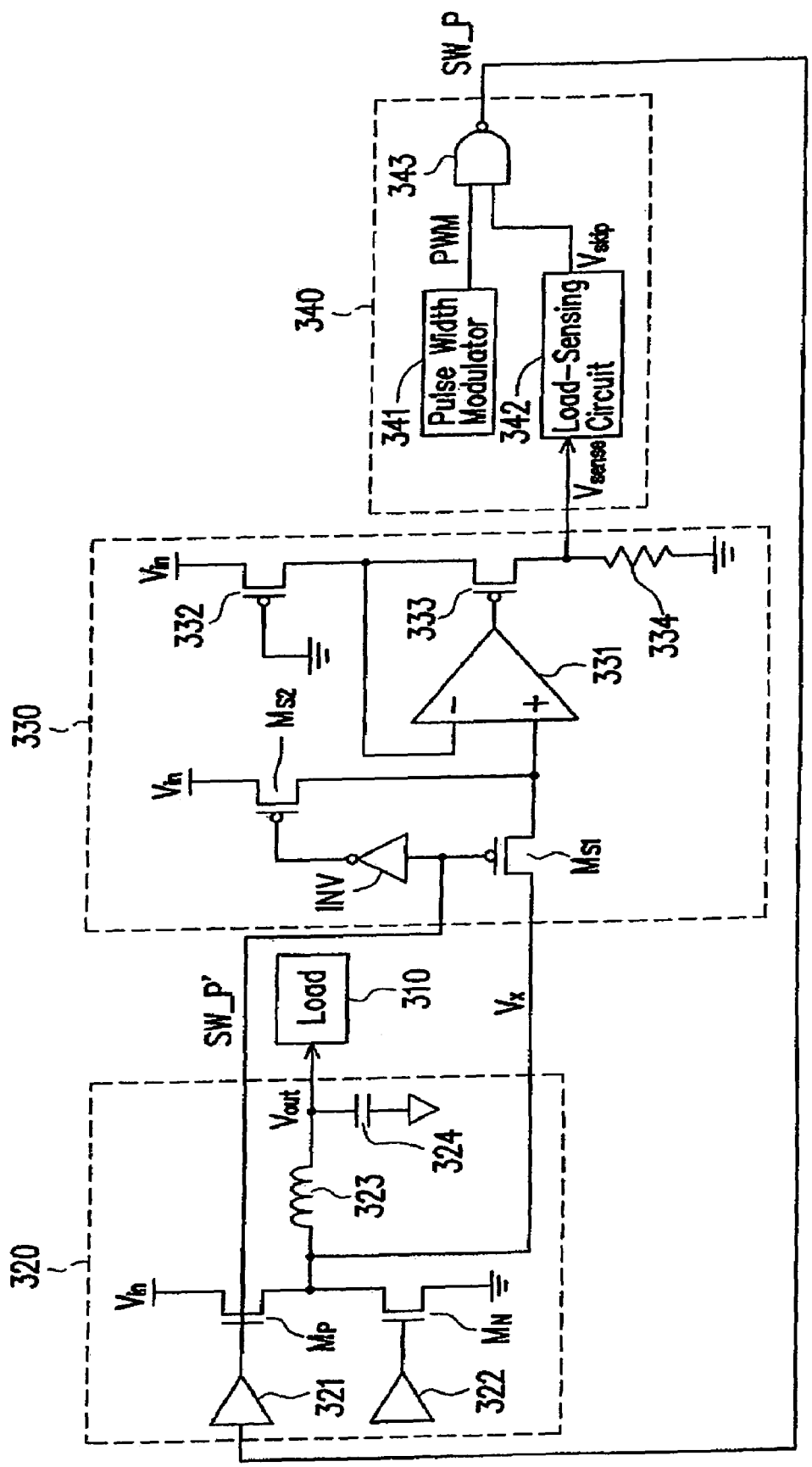
FIG. 3 is a circuit diagram illustrating how the load-sensing circuit controls the power supply device according to the embodiment of the present invention.

FIG. 3 is a circuit diagram illustrating how the load-sensing circuit controls the power supply device according to the embodiment of the present invention. Referring to FIG. 3, the power supply device supplies an output voltage $V_{out}$ to a load 310. The power supplier comprises a power output unit 320, a feedback unit 330, and a control unit 340. The power output unit 320 is electrically connected to the load 310, so as to adjust and supply the output voltage $V_{out}$ to the load 310 according to a driving signal SW_P. The feedback unit 330 is electrically connected to the power output unit 320. The feedback unit 330 senses the output state of the power output unit 320, and outputs corresponding load information (in this embodiment, the load information is a current sensing signal $V_{sense}$). The control unit 340 is electrically connected to the feedback unit 330 and the power output unit 320. In the embodiment, the pulse-skipping mode (PSM) is taken as an example to illustrate the application of the present invention used as a load-sensing circuit in the control unit 340. The control unit 340 senses the output state of the power output unit 320 through the feedback unit 330, so the control unit 340 can change the PSM dynamically with the load according to the output state of the power output unit 230, so as to control the power output unit 320.

The PSM controls the output of the power output 320 by skipping partial pulses of the internal pulse width modulated (PWM) clock of the control unit 340, and outputting the skipped internal pulses as the driving signal SW_P. The control unit 340 decides the skipping proportion of the internal pulses according to the load information output from the feedback unit 330. In this embodiment, the pulse width modulator 341 can be implemented according to the conventional art, and the details will not be described herein again.

In this embodiment, the power output unit 320 is realized with the buck converter circuit, which comprises a power transistor $M_P$, a power transistor $M_N$, an induction coil (an inductor 323 herein), and a load capacitor 324. The control terminals of the power transistors $M_P$ and $M_N$ are controlled by the control unit 340. The first terminal of the power transistor $M_P$ is electrically connected to a voltage source $V_{in}$, where $V_X$ is the voltage of the second terminal of the power transistor $M_P$. The first terminal of the power transistor $M_N$ is electrically connected to the second terminal of the power transistor $M_P$, and the second terminal of the power transistor $M_N$ is connected to the ground. The first terminal of the inductor 323 is electrically connected to the second terminal of the power transistor $M_P$, and the second terminal of the inductor 323 supplies an output voltage $V_{out}$. The first terminal of the load capacitor 324 is connected to the second terminal of the inductor 323, and the second terminal of the load capacitor 324 is connected to the ground.

The control unit 340 changes the PSM dynamically according to the load state, so as to generate and output the driving signal SW_P to a driver 321. The control signal of the driver 322 can be generated by inverting and appropriately adjusting the driving signal SW_P, which can be implemented according to the conventional art, and the details will not be described herein again. The power transistors $M_P$ and $M_N$ are turned on and off alternately as driven respectively by the drivers 321 and 322. The output current $I_{out}$ flows through the induction coil, and is supplied to the load 310.

The feedback unit 330 comprises an operational amplifier 331, a thirteenth transistor Ms1, a fourteenth transistor Ms2, an NOT gate INV, a fifteenth transistor 332, a sixteenth transistor 333, and a resistor 334. The input terminal of the NOT gate INV is electrically connected to the control terminal of the first power transistor $M_P$ to receive the signal SW_P', and the output terminal is electrically connected to the gate of the fourteenth transistor Ms2. The gate of the P-type transistor Ms1 is electrically connected to the control terminal of the first power transistor $M_P$ to receive the signal SW_P', and the source of the transistor Ms1 is electrically connected to the second terminal of the first power transistor $M_P$ to receive the voltage $V_X$. The source of the P-type transistor Ms2 is electrically connected to the voltage source $V_{in}$, and the drain is electrically connected to the drain of the transistor Ms1. The first input terminal (the positive input terminal herein) of the operational amplifier 331 is electrically connected to the drain of the transistor Ms1, and the second input terminal (a negative input terminal herein) and the output terminal of the operational amplifier 331 are respectively connected to the source and the gate of the transistor 333. The source of the P-type transistor 332 is electrically connected to the voltage source $V_{in}$, and the gate is connected to the ground. The source of the P-type transistor 333 is electrically connected to the drain of the transistor 332, and the drain voltage level of the transistor 333 is the current sensing signal $V_{sense}$ output from the feedback unit 330. The first terminal of the resistor 334 is electrically connected to the drain of the transistor 333, and the second terminal of the resistor 334 is connected to the ground.

The circuit diagram of the control unit 340 comprises a pulse width modulator 341, a load-sensing circuit 342, and a select logic (a NAND gate 343 herein). The pulse width modulator 341 generates the pulse signal PWM in a pulse width modulation method according to the load information (the current sensing signal $V_{sense}$ herein) output from the feedback unit 330. Those skilled in the art can realized the pulse width modulator 341 with any pulse width modulation technique according to the requirements, and the details will not be described herein again.

The load sensing circuit 342 is electrically connected to the feedback unit 330. The load sensing circuit 342 samples the load information (the current sensing signal $V_{sense}$ herein) output from the feedback unit 330 in every sensing period. The load-sensing circuit 342 detects the output state of the power supply device according to every sampling result, and further outputs the control signal (the control signal is used as the skipping signal $V_{skip}$ in this embodiment) according to the current sensing signal $V_{sense}$ output from the feedback unit 330. The skipping signal $V_{skip}$ controls the select logic, and decides the skipping proportion of the pulse width modulated pulse signal PWM.

Figure 4:
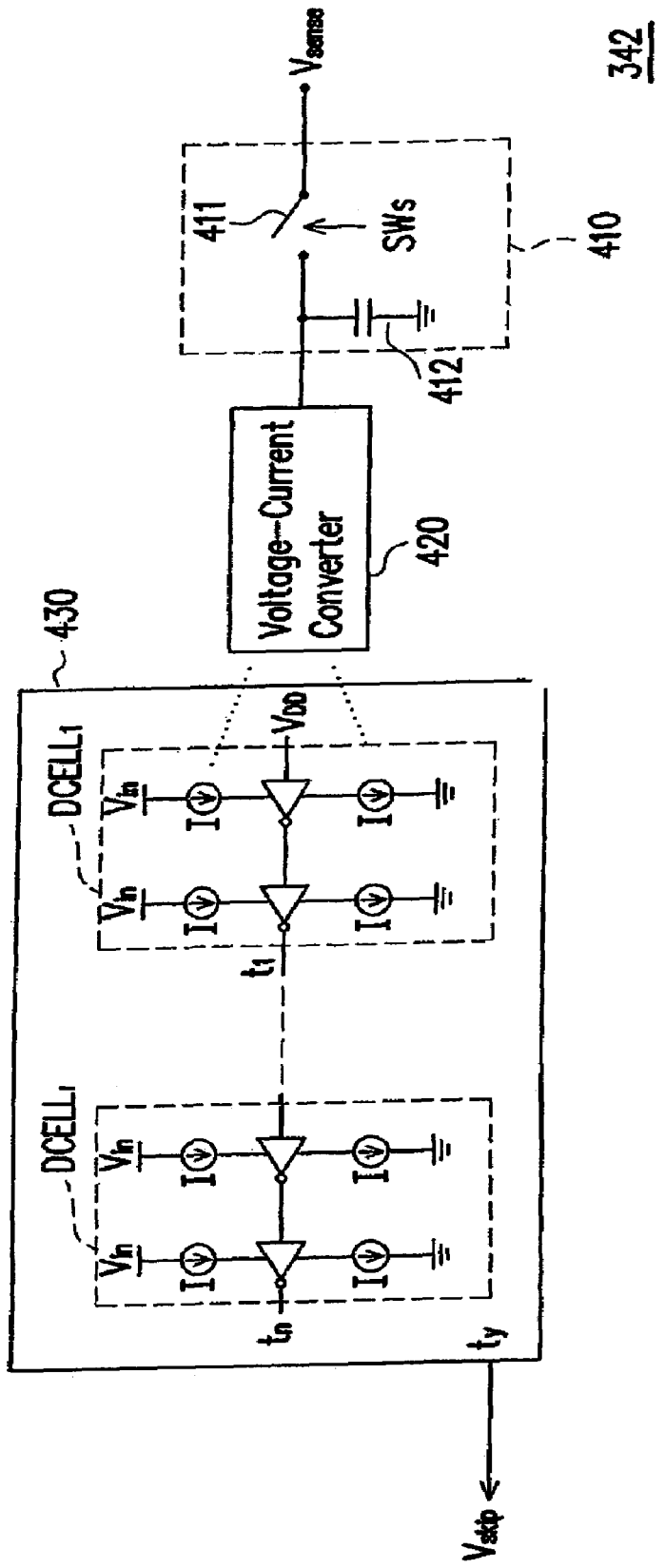
FIG. 4 is a circuit diagram illustrating the load-sensing circuit of FIG. 3 according to the embodiment of the present invention.
Figure 5:
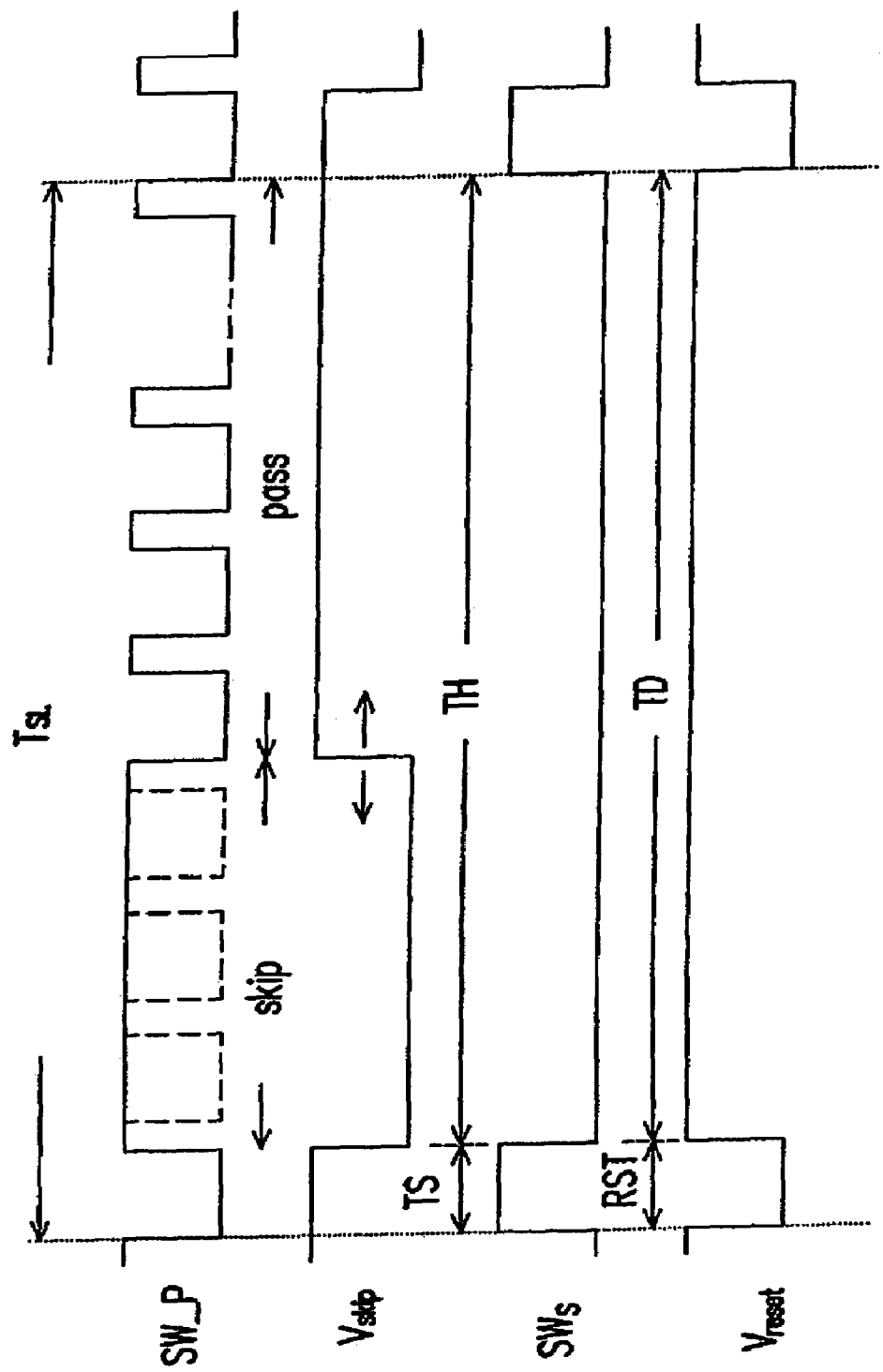
FIG. 5 is a timing diagram of the relevant signals of FIGS. 3 and 4 according to the embodiment of the present invention.

FIG. 4 is the circuit diagram illustrating the load-sensing circuit 342 of FIG. 3 according to the embodiment of the present invention. FIG. 5 is a timing diagram of the relevant signals of FIGS. 3 and 4 according to the embodiment of the present invention. In this embodiment, the load-sensing circuit 342 comprises a sampling unit 410, a voltage-current converter 420, and a delay line 430.

The sampling unit 410 is electrically connected to the feedback unit 330, so as to sample the load information when the sensing period $T_{SL}$ starts. Referring to FIGS. 3, 4, and 5 together, the sampling unit 410 comprises a sampling switch 411 and a sampling capacitor 412. The first terminal of the sampling switch 411 is electrically connected to the feedback unit 330 to receive the load information (the current sensing signal $V_{sens}$), and the second terminal of the sampling switch 411 is electrically connected to the voltage-current converter 420, so as to switch on in the first period TS of the sensing period $T_{SL}$ and switch off in the second period TH. The first terminal of the sampling capacitor 412 is electrically connected to the second terminal of the sampling switch 411, and the second terminal of the sampling capacitor 412 is connected to the ground. Therefore, the sampling unit 410 samples the current sensing signal $V_{sense}$ and keeps it in the sampling capacitor 412 in every sensing period $T_{SL}$ according to the time sequence of the control signal $SW_S$.

The voltage-current converter 420 is electrically connected to the output of the sampling unit 410 and the delay-control terminal of the delay line 430, so as to convert the sampling result of the sampling unit 410 and output the converted result. The delay line 430 comprises n stages of delay cells $DCELL_1 \sim DCELL_n$ connected in series. The delay time of each delay cell is decided according to the converted result of the voltage-current converter 420. The first level (the high logic level herein) is transmitted stage by stage between the delay cells $DCELL_1 \sim DCELL_n$ in the delay period TD of the sensing period $T_{SL}$, and the outputs of the delay cells $DCELL_1 \sim DCELL_n$ are reset to the second level (the low logic level herein) in the reset period RST of the sensing period $T_{SL}$. Wherein, at least an output terminal $t_y$ $(0 < y \leq n)$ of delay cell $DCELL_y$ among the delay cells $DCELL_1 \sim DCELL_n$ used as output terminal of the delay line 430. The load-sensing circuit 342 uses one output signal of the output terminal $t_y$ among the delay cells $DCELL_1 \sim DCELL_n$ as the skipping signal $V_{skip}$.

Figure 6:
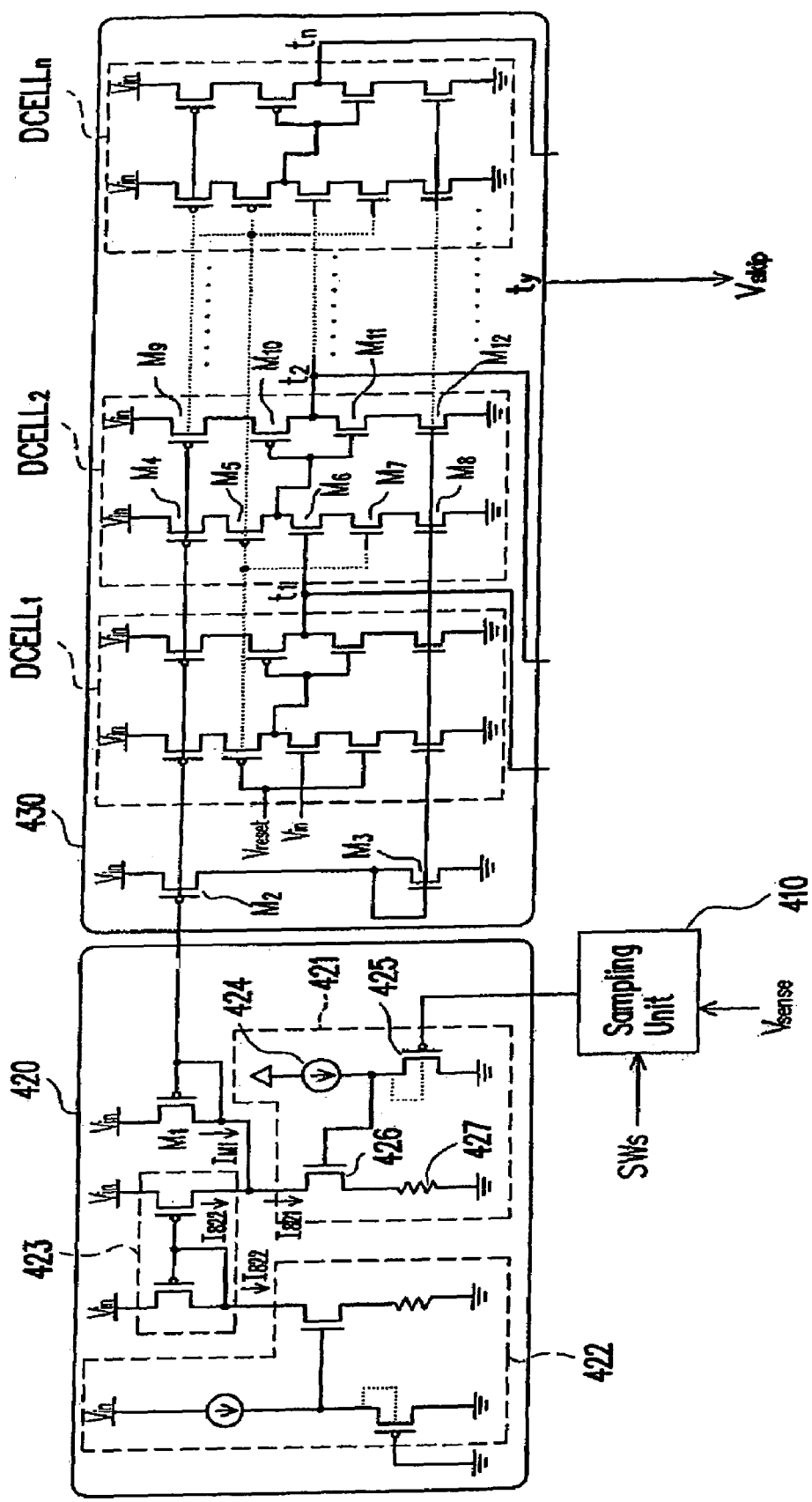
FIG. 6 is a detailed circuit diagram illustrating the voltage-current converter and the delay line of FIG. 4 according to the embodiment of the present invention.

FIG. 6 is a detailed circuit diagram illustrating the voltage-current converter 420 and the delay line 430 of FIG. 4 according to the embodiment of the present invention. The voltage-current converter 420 comprises a first voltage-current converting cell 421, a second voltage-current converting cell 422, a current mirror 423, and a first transistor M1. The input terminal of the first voltage-current converting cell 421 is electrically connected to the sampling unit 410, so as to decide the current value of the output terminal according to the voltage at the input terminal. The input terminal of the second voltage-current converting cell 422 is electrically connected to the predetermined voltage (the ground voltage herein), so as to decide the current value of the output terminal according to the voltage at the input terminal. In this embodiment, the first voltage-current converting cell 421 and the second voltage-current converting cell 422 have the same circuit architecture. The first voltage-current converting cell 421 comprises a current source 424, a first converting transistor 425, a second converting transistor 426, and a converting resistor 427. The gate of the transistor 425 serves as the input terminal of the first voltage-current converting cell 421, the source is electrically connected to the current source 424, and the drain is connected to the ground. The gate of the transistor 426 is electrically connected to the source of the transistor 425, and the drain of the transistor 426 serves as the output terminal of the first voltage-current converting cell 421. The first terminal of the resistor 427 is electrically connected to the source of the transistor 426, and the second terminal of the resistor 427 is connected to the ground.

The master current terminal of the current mirror 423 is electrically connected to the output terminal of the second voltage-current converting cell 422, and the slave current terminal of the current mirror 423 is electrically connected to the output terminal of the first voltage-current converting cell 421. The source of the transistor M1 is electrically connected to the voltage source $V_{in}$, and the gate and drain are both electrically connected to the output terminal of the first voltage-current converting cell 421, wherein the gate voltage of the transistor M1 serves as the converted result of the voltage-current converter 420. Since the first voltage-current converting cell 421 and the second voltage-current converting cell 422 have the same circuit architecture, the output currents $I_{821}$ and $I_{822}$ of the two cells have the same temperature variation factor. The current $I_{M1}$ of the transistor M1 is equal to $I_{821}$-$I_{822}$. Since the temperature variation of the current $I_{821}$ and $I_{822}$ can be cancelled by each other due to the same temperature variation factor, the voltage-current converter 420 is not affected by the temperature, and can provide the stable output current $I_{M1}$, where the current $I_{M1}$ of the transistor M1 serves as the converted result of the voltage-current converter 420. Since the current $I_{M1}$ is in proportion to the gate voltage of the transistor M1, in this embodiment, the converted result of the voltage-current converter 420 (the current $I_{M1}$) is transmitted to the delay line 430 by means of the gate voltage of the transistor M1. In this embodiment, the converted result of the voltage-current converter 420 (the current $I_{M1}$) is transmitted to the delay line 430 by means of the current mirror.

The delay line 430 comprises a second transistor M2, a third transistor M3, and delay cells $DCELL_1$~$DCELL_n$. The gate of the transistor M2 (i.e., the delay-control terminal of the delay line 430) is electrically connected to the gate of the transistor M1, so as to receive the converted result of the voltage-current converter 420. The source of the transistor M2 is electrically connected to the voltage source $V_{in}$. The gate and the drain of the transistor M3 are both electrically connected to the drain of the transistor M2, and the source of the transistor M3 is connected to the ground. The delay cells $DCELL_1$~$DCELL_n$ are electrically connected to the gates of the transistors M2 and M3, so as to decide the current levels of the delay cells $DCELL_1$~$DCELL_n$ according to the gate voltage levels and the ratio of geometric size of the transistors M2 and M1, and further decide the delay time $T_d$ of the delay cells $DCELL_1$~$DCELL_n$ according to the current levels of the delay cells.

Herein, only the detailed circuit of the delay cell $DCELL_2$ is illustrated, and the circuits of other delay cells can be implemented in accordance with the illustration above. The delay cell $DCELL_2$ comprises a first current source, a second current source, a third current source, a fourth current source, a first inverter, and a second inverter. In this embodiment, the aforementioned current sources are respectively implemented with the fourth transistor M4, the eighth transistor M8, the ninth transistor M9, and the twelfth transistor M12, and the supplied current values I are decided by the gate voltage levels of the transistors M2, M3 and the corresponding geometric ratio between the fourth transistor M4, the eighth transistor M8, the ninth transistor M9, the twelfth transistor M12, and the transistors M2, M3 respectively.

The first inverter comprises a fifth transistor M5, a sixth transistor M6, and a seventh transistor M7. The first inverter is coupled between the first current source and the second current source to obtain the power, and is used to invert the input terminal signal of the first inverter in the delay period TD of the sensing period $T_{SL}$ according to the signal $V_{reset}$ from the reset terminal and then output it, and to reset the output of the first inverter to the first level (the high logic level herein) in the reset period RST of the sensing period. The input terminal of the first inverter is coupled to the output of the delay cell $DCELL_1$ of the preceding stage.

The second inverter comprises a tenth transistor M10 and an eleventh transistor M11. The second inverter is coupled between the third current source and the fourth current source to obtain the power. The input terminal of the second inverter is coupled to the output terminal of the first inverter, and the output terminal of the second inverter serves as the output of the delay cell $DCELL_2$ of the current stage.

The transistors M4, M5, M6, M7, and M8 are connected in series between the voltage source $V_{in}$ and the ground, and the transistors M9, M10, M11, and M12 are also connected in series between the voltage source $V_{in}$ and the ground. The gates of the transistors M4 and M9 are electrically connected to the gate of the transistor M2. The gates of the transistors M8 and M12 are electrically connected to the gate of the transistor M3. The gates of the transistors M5 and M7 receive the signal $V_{reset}$ of the reset terminal.

The drain of the transistor M6 is electrically connected to the gates of the transistors M10 and M11, and the gate of the transistor M6 is electrically connected to the output terminal $t_1$ of the delay cell of the preceding stage (the $DCELL_1$ herein). The drains of the transistors M10 and M11 are the output terminal $t_2$ of the delay cell $DCELL_2$. The transistors M5 and M7 are controlled by the signal $V_{reset}$ of the reset terminal, so the transistor M5 is switched off and the transistor M7 is switched on in the delay period TD, and the transistor M5 is switched on and the transistor M7 is switched off in the reset period RST.

Referring to FIG. 3, the selected logic is electrically connected to the load-sensing circuit 342, the pulse width modulator 341, and the power output unit 320. The skipping signal $V_{skip}$ is output according to the load-sensing circuit 342, partial pulses of the pulse width modulated pulse signal PWM are skipped according to the skipping signal $V_{skip}$ (as shwon in FIG. 5), and the driving signals SW_P and SW_N are output according to the partially skipped pulse signal.

An analog-to-digital converter (ADC) is taken as an example to illustrate the delay line of the present invention applied in the analog-to-digital converter. Those skilled in the art can implement the present invention by other types of signal converting devices within the spirit of the present invention.

Figure 7:
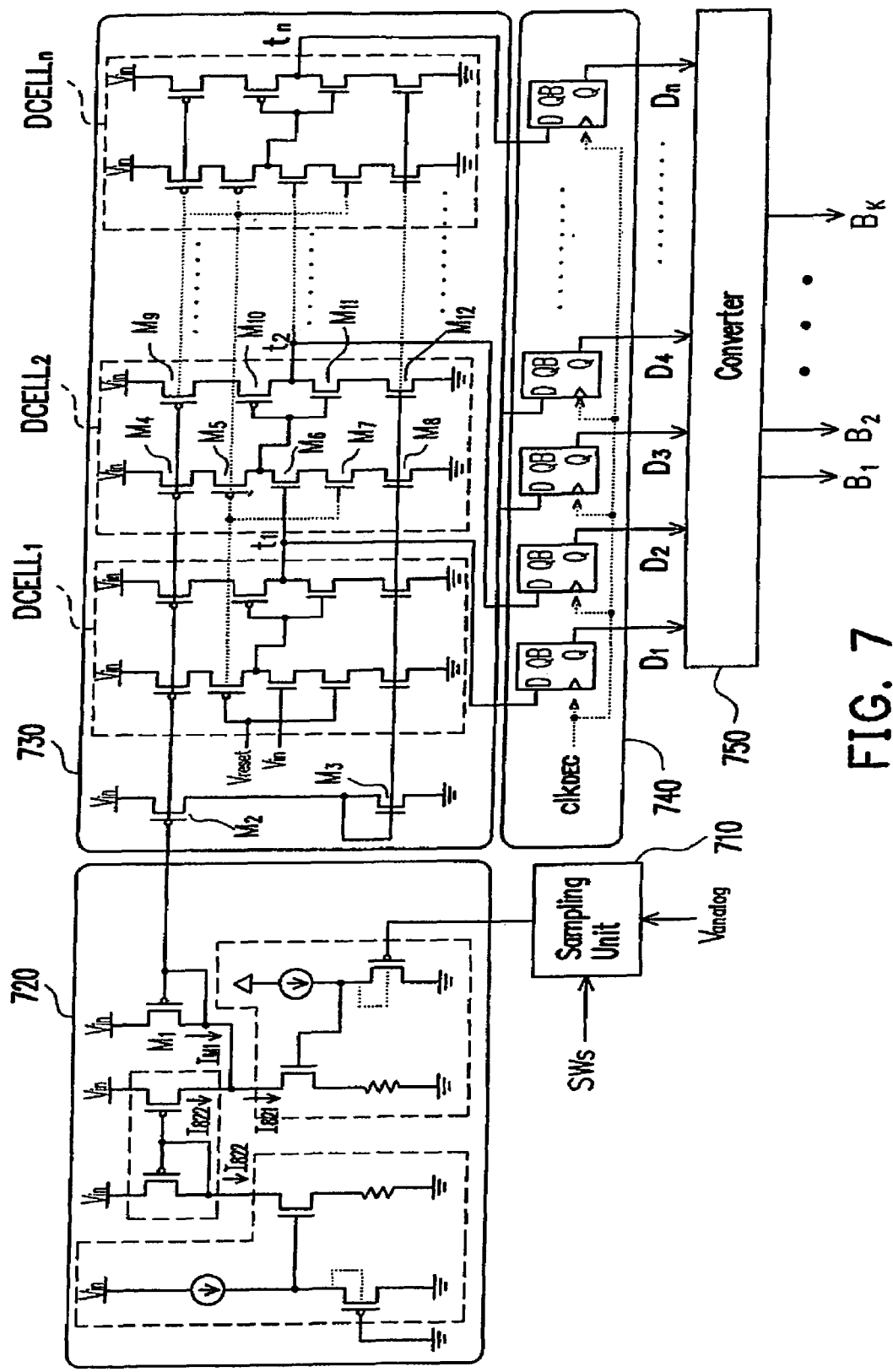
FIG. 7 is a circuit diagram illustrating an analog-to-digital converter according to the embodiment of the present invention.
Figure 8:
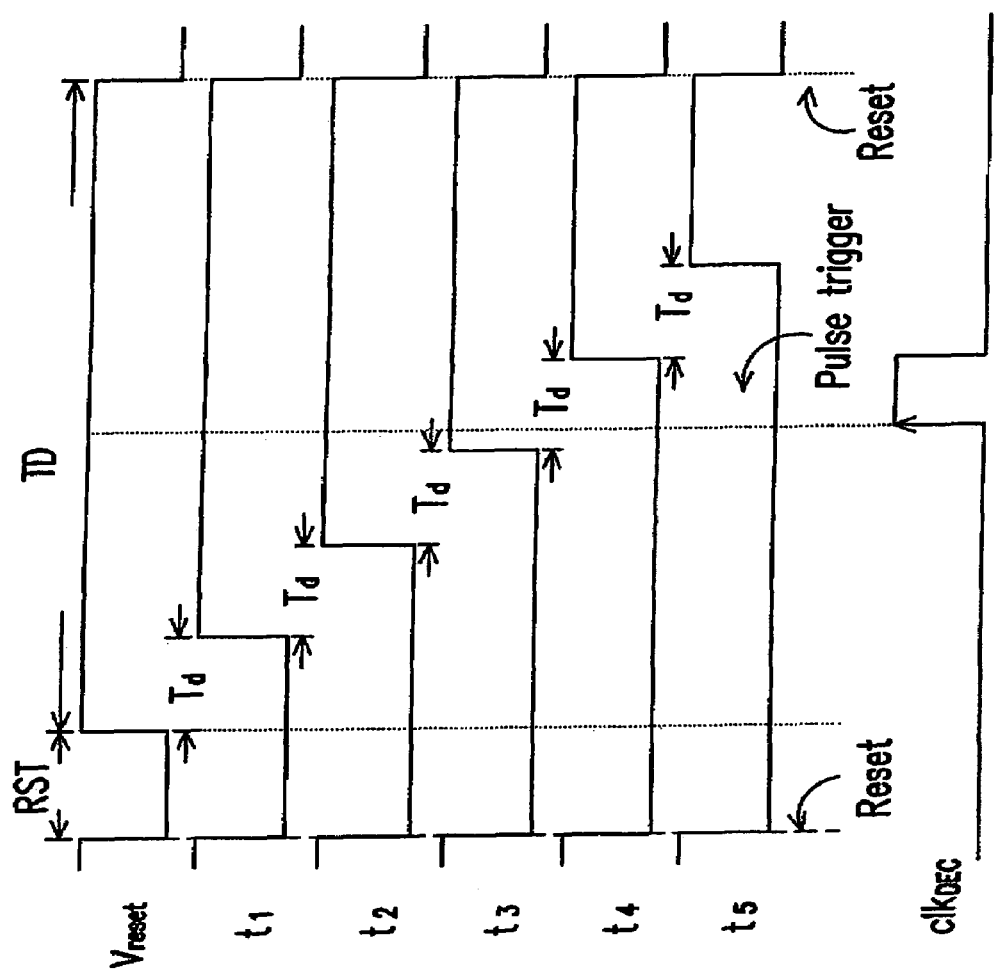
FIG. 8 is a timing diagram of the latch signal of the decoding unit of FIG. 7 according to the embodiment of the present invention.

FIG. 7 is a circuit diagram illustrating an analog-to-digital converter according to the embodiment of the present invention, and FIG. 8 is a timing diagram of the latch signal of the decoding unit 740 of FIG. 7 according to the embodiment of the present invention. Referring to FIGS. 7 and 8, the analog-to-digital converting device samples the analog signal $V_{analog}$ in every sensing period $T_{SL}$, and converts the sampling result to digital codes $D_1$~$D_n$, wherein the digital codes $D_1$~$D_n$ are also called as thermometer codes. The analog-to-digital converting device comprises a sampling unit 710, a voltage-current converter 720, a delay line 730, and a latch unit 740. The sampling unit 710 samples the analog signal $V_{analog}$ in the delay period RST of the sensing period in accordance with the control of the signal $SW_S$.

The voltage-current converter 720 is coupled to the output of the sampling unit 710 and the delay-control terminal of the delay line 730. The voltage-current converter 720 converts the sampling result of the sampling unit 710, and outputs the converted result, in which the converted result decides the delay time $T_d$ of the delay line 730. The delay line 730 transmits the first level stage by stage between the delay cells according to the decided delay time $T_d$ in the delay period TD of the sensing period $T_{SL}$, and reset the outputs $t_1 \sim t_n$ of the delay cells $DCELL_1 \sim DCELL_n$ to the second level in the reset period RST of the sensing period $T_{SL}$, wherein the delay period TD and the reset period RST of the sensing period $T_{SL}$ are decided by the signal $V_{reset}$ of the reset terminal. The voltage-current converter 720 and the delay line 730 of this embodiment can be implemented according to the voltage-current converter 420 and the delay line 430 in FIG. 6, and the details will not be described herein again.

The latch unit 740 comprises a plurality of D-type flip-flops, each of the D-type flip-flops is coupled to one of the output terminals $t_1 \sim t_n$ of the delay line 730, so as to latch signals of the output terminals $t_1 \sim t_n$ according to the trigger of the sampling clock $clk_{DEC}$ and to output the digital codes $D_1 \sim D_n$. Those skilled in the art can also arrange a code converter 750 in the analog-to-digital converting device as desired. The code converter 750 is electrically connected to the latch unit 740, so as to convert the thermometer digital codes $D_1 \sim D_n$ into binary codes $B_1 \sim B_K$ or other codes.

During the code conversion, the aforementioned analog-to-digital (ADC) not only utilizes the basic circuit to significantly reduce the required power consumption, but also maintains quite high precision. The analog signal $V_{analog}$ to be converted into the digital codes generates a stable current that is not affected by the temperature with the voltage-current converter 720, and the delay line 730 formed by serially connecting the inverters is further driven to transmit the signal. As the transmission time of signal is in inverse proportion to the driving current of the circuit in the architecture of the inverters, the change of the analog signal $V_{analog}$ influences the signal transmission time, so as to obtain the thermometer digital codes $D_1 \sim D_n$. Then the code converter 750 is used to convert the digital codes $D_1 \sim D_n$ into the binary codes $B_1 \sim B_K$. When the sensing period $T_{SL}$ is finished, each of the delay cells $DCELL_1 \sim DCELL_n$ resets synchronously for the next code conversion.

Compared with the conventional method that distinguishes the voltages by using comparators, the present invention uses the delay line to convert the electric signals to the delay time and to obtain the corresponding digital codes. As there is no extra power consumption after the inverter in the delay line finishes the signal transmission, compared with the continuous power consumption of the comparators, the delay line of the present invention has low power consumption and maintains high precision irrelevant to temperature, thereby significantly improving the performance of the analog-to-digital converter.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A delay line, comprising:
    a delay-control terminal;
    a reset terminal; and
    n stages of delay cells $DCELL_x$ connected in series, wherein each of the delay cells $DCELL_x$ is coupled to the delay-control terminal and the reset terminal for transmitting a first level stage by stage between the delay cells according to a delay time decided by the delay-control terminal in a sensing period, and resetting the outputs of the delay cells to a second level when the sensing period is finished, wherein the $DCELL_x$ is the $x^{th}$ delay cell, where $0<x \leq n$, and the sensing period is decided by a signal from the reset terminal;
    wherein at least an output terminal $t_y$ of a delay cell $DCELL_y$, among the delay cells $DCELL_1 \sim DCELL_n$ used as output terminal of the delay line, where $0<y \leq n$; and
    wherein the delay cell $DCELL_x$ comprises:
        a first current source for deciding the supplied current value according to a signal of the delay-control terminal;
        a second current source for deciding the supplied current value according to a signal of the delay-control terminal;
        a third current source for deciding the supplied current value according to a signal of the delay-control terminal;
        a fourth current source for deciding the supplied current value according to a signal of the delay-control terminal;
        a first inverter coupled between the first current source and the second current source to obtain power, for inverting and output the signal of input terminal of the first inverter in the sensing period and resetting the output of the first inverter to the second level after the sensing period is finished according to the signal from the reset terminal, wherein an input terminal of the first inverter is coupled to an output of a delay cell $DCELL_{x-1}$ of the preceding stage; and
        a second inverter coupled between the third current source and the fourth current source to obtain power, wherein an input terminal of the second inverter is coupled to the output terminal of the first inverter, and an output terminal of the second inverter serves as the output of the delay cell $DCELL_x$ of the current stage.

2. The delay line as claimed in claim 1, wherein the first level and the second level are respectively a high logic level and a low logic level.

3. The delay line as claimed in claim 1, wherein the delay cell $DCELL_x$ further comprises:
    a P-type transistor, wherein a gate of the P-type transistor is coupled to the delay-control terminal, the first current source, and the third current source, and a source of the P-type transistor is coupled to a voltage source; and
    an N-type transistor, wherein a gate and a drain of the N-type transistor are coupled to the drain of the P-type transistor, and a source of the N-type transistor is connected to the ground.

4. The delay line as claimed in claim 3, wherein in the delay cell $DCELL_x$,
    the first current source comprises:
        a fourth transistor, wherein a source of the fourth transistor is coupled to the voltage source, and a gate of the fourth transistor is electrically connected to the gate of the P-type transistor;
    a first inverter comprises:
        a fifth transistor, wherein a source of the fifth transistor is coupled to the drain of the fourth transistor, and a gate of the fifth transistor is coupled to the reset terminal;
        a sixth transistor, wherein a drain of the sixth transistor is coupled to the drain of the fifth transistor, and a gate of the sixth transistor is coupled to the output of the delay cell $DCELL_{x-1}$ of the preceding stage; and a seventh transistor, wherein a drain of the seventh transistor is coupled to the source of the sixth transistor, and a gate of the seventh transistor is coupled to the reset terminal;

the second current source comprises:

an eighth transistor, wherein a drain of the eighth transistor is coupled to the source of the seventh transistor, a gate of the eighth transistor is coupled to the gate of the N-type transistor, and a source of the eighth transistor is connected to the ground;

the third current source comprises:

a ninth transistor, wherein a source of the ninth transistor is coupled to the voltage source, and a gate of the ninth transistor is electrically connected to the gate of the P-type transistor;

the second inverter comprises:

a tenth transistor, wherein a source of the tenth transistor is coupled to the drain of the ninth transistor, a gate of the tenth transistor is coupled to the drain of the fifth transistor, and the drain of the tenth transistor is the output of the delay cell $DCELL_x$; and an eleventh transistor, wherein a drain of the eleventh transistor is coupled to the drain of the tenth transistor, and a gate of the eleventh transistor is coupled to the drain of the fifth transistor; and the fourth current source comprises:

a twelfth transistor, wherein a drain of the twelfth transistor is coupled to a source of the eleventh transistor, a gate of the twelfth transistor is coupled to the gate of the N-type transistor, and a source of the twelfth transistor is connected to the ground.

5. A load-sensing circuit for sampling a load information in every sensing period, and converting a sampling result to a control signal, wherein the load-sensing circuit comprises:

a delay line, comprising:

a delay-control terminal;

a reset terminal; and n stages of delay cells $DCELL_x$ connected in series, wherein each of the delay cells $DCELL_x$ is coupled to the delay-control terminal and the reset terminal for transmitting a first level stage by stage between the delay cells according to a delay time decided by the delay-control terminal in the sensing period, and resetting the outputs of the delay cells to a second level when the sensing period is finished, wherein the $DCELL_x$ is the $x^{th}$ delay cell, where $0<x\leq n$, and the sensing period is decided by the signal from the reset terminal; wherein at least one output terminal $t_y$ of delay cell $DCELL_y$ among the delay cells $DCELL_1 \sim DCELL_n$ for providing the control signal, where $0<y\leq n$;

a sampling unit for sampling the load information when the sensing period starts; and a voltage-current converter coupled to the output of the sampling unit and the delay-control terminal of the delay line, so as to convert the sampling result of the sampling unit and output the converted result, wherein the converted result decides the delay time of the delay line; and wherein the voltage-current converter comprises:

a first voltage-current converting cell, wherein an input terminal of the first voltage-current converting cell is electrically connected to the sampling unit, so as to decide the current value of an output terminal according to the voltage at the input terminal;

a second voltage-current converting cell, wherein an input terminal of the second voltage-current converting cell is electrically connected to a predetermined voltage, so as to decide the current value of an output terminal according to the voltage at the input terminal;

a current mirror, wherein a master current terminal of the current mirror is electrically connected to the output terminal of the second voltage-current converting cell, and a slave current terminal of the current mirror is electrically connected to the output terminal of the first voltage-current converting cell; and a first transistor, wherein a source of the first transistor is electrically connected to a voltage source, a gate and a drain of the first transistor are both electrically connected to the output terminal of the first voltage-current converting cell and the delay-control terminal of the delay line, and a gate voltage of the first transistor serves as a converted result of the voltage-current converter.

6. The load-sensing circuit as claimed in claim 5, wherein the sampling unit comprises:

a sampling switch, wherein a first terminal of the sampling switch receives the load information, a second terminal of the sampling switch is electrically connected to the voltage-current converter, so as to switch ON in a first period and switch OFF in a second period; and a sampling capacitor, wherein a first terminal of the sampling capacitor is electrically connected to the second terminal of the sampling switch, and a second terminal of the sampling capacitor is connected to the ground.

7. The load-sensing circuit as claimed in claim 5, wherein the first voltage-current converting cell and the second voltage-current converting cell have a same circuit architecture.

8. The load-sensing circuit as claimed in claim 5, wherein the first voltage-current converting cell comprises:

a current source;

a first converting transistor, wherein a gate of the first converting transistor serves as the input terminal of the first voltage-current converting cell, a first source/drain of the first converting transistor is connected to the current source, and a second source/drain of the first converting transistor is connected to the ground;

a second converting transistor, wherein a gate of the second converting transistor is electrically connected to the first source/drain of the first converting transistor, and a first source/drain of the second converting transistor serves as the output terminal of the first voltage-current converting cell; and a converting resistor, wherein a first terminal of the converting resistor is electrically connected to the second source/drain of the second converting transistor, and a second terminal of the converting resistor is connected to the ground.

9. The load-sensing circuit as claimed in claim 5, wherein the delay cell $DCELL_x$ of the delay line comprises:

a first current source for deciding the supplied current value according to a signal of the delay-control terminal;

a second current source for deciding the supplied current value according to a signal of the delay-control terminal;

a third current source for deciding the supplied current value according to a signal of the delay-control terminal;

a fourth current source for deciding the supplied current value according to a signal of the delay-control terminal;

a first inverter coupled between the first current source and the second current source to obtain power, for inverting and output an input terminal signal of the first inverter in the sensing period and resetting the output of the first inverter to the first level after the sensing period is finished according to the signal from the reset terminal, wherein an input terminal of the first inverter is coupled to the output of a delay cell $DCELL_{x-1}$ of the preceding stage; and a second inverter coupled between the third current source and the fourth current source to obtain power, wherein an input terminal of the second inverter is coupled to an output terminal of the first inverter, and an output terminal of the second inverter serves as the output of the delay cell $DCELL_x$ of the current stage.

10. The load-sensing circuit as claimed in claim 9, wherein the delay cell $DCELL_x$ further comprises:

a P-type transistor, wherein a gate of the P-type transistor is coupled to the delay-control terminal, the first current source, and the third current source, and a source of the P-type transistor is coupled to a voltage source; and an N-type transistor, wherein a gate and a drain of the N-type transistor are coupled to a drain of the P-type transistor, and a source of the N-type transistor is connected to the ground;

and in the delay cell $DCELL_x$, the first current source comprises:
a fourth transistor, wherein a source of the fourth transistor is coupled to the voltage source, and a gate of the fourth transistor is electrically connected to the gate of the P-type transistor;

the first inverter comprises:
a fifth transistor, wherein a source of the fifth transistor is coupled to the drain of the fourth transistor, and a gate of the fifth transistor is coupled to the reset terminal;
a sixth transistor, wherein a drain of the sixth transistor is coupled to the drain of the fifth transistor, and a gate of the sixth transistor is coupled to the output of the delay cell $DCELL_{x-1}$ of the preceding stage; and
a seventh transistor, wherein a drain of the seventh transistor is coupled to the source of the sixth transistor, and a gate of the seventh transistor is coupled to the reset terminal;

the second current source comprises:
an eighth transistor, wherein a drain of the eighth transistor is coupled to the source of the seventh transistor, a gate of the eighth transistor is coupled to the gate of the N-type transistor, and a source of the eighth transistor is connected to the ground;

the third current source comprises:
a ninth transistor, wherein a source of the ninth transistor is coupled to the voltage source, and a gate of the ninth transistor is electrically connected to the gate of the P-type transistor;

the second inverter comprises:
a tenth transistor, wherein a source of the tenth transistor is coupled to the drain of the ninth transistor, a gate of the tenth transistor is coupled to the drain of the fifth transistor, and the drain of the tenth transistor is the output of the delay cell $DCELL_x$; and
a eleventh transistor, wherein a drain of the eleventh transistor is coupled to the drain of the tenth transistor, and a gate of the eleventh transistor is coupled to the drain of the fifth transistor; and the fourth current source comprises:
a twelfth transistor, wherein a drain of the twelfth transistor is coupled to the source of the eleventh transistor, a gate of the twelfth transistor is coupled to the gate of the N-type transistor, and a source of the twelfth transistor is connected to the ground.

11. An analog-to-digital converting device for sampling an analog signal in every sensing period, and converting the sampling result to a digital code, wherein the analog-to-digital converting device comprises:

a delay line, comprising:
a delay-control terminal;
a reset terminal; and
n stages of delay cells $DCELL_x$ connected in series, wherein each of the delay cells $DCELL_x$ is coupled to the delay-control terminal and the reset terminal for transmitting a first level stage by stage between the delay cells according to a delay time decided by the delay-control terminal in the sensing period, and resetting the outputs of the delay cells to a second level when the sensing period is finished, wherein the $DCELL_x$ is the $x^{th}$ delay cell, where $0<x\leq n$, and the sensing period is decided by the signal from the reset terminal; wherein at least one output terminal $t_y$ of delay cell $DCELL_y$ among the delay cells $DCELL_1 \sim DCELL_n$ used as output terminal of the delay line, where $0<y\leq n$; and wherein the delay cell $DCELL_x$ of the delay line comprises;

a first current source for deciding the supplied current value according to a signal of the delay-control terminal;

a second current source for deciding the supplied current value according to a signal of the delay-control terminal;

a third current source for deciding the supplied current value according to a signal of the delay-control terminal;

a fourth current source for deciding the supplied current value according to a signal of the delay-control terminal;

a first inverter coupled between the first current source and the second current source to obtain power, for inverting and output an input terminal signal of the first inverter in the sensing period and resetting the output of the first inverter to the first level after the sensing period is finished according to the signal from the reset terminal, wherein an input terminal of the first inverter is coupled to the output of a delay cell $DCELL_{x-1}$ of the preceding stage; and a second inverter coupled between the third current source and the fourth current source to obtain power, wherein an input terminal of the second inverter is coupled to the output terminal of the first inverter, and an output terminal of the second inverter serves as the output of the delay cell $DCELL_x$ of the current stage;

a sampling unit for sampling the analog signal when the sensing period starts; and a voltage-current converter coupled to the output of the sampling unit and the delay-control terminal of the delay line, so as to convert the sampling result of the sampling unit and output the converted result, wherein the converted result decides the delay time of the delay line; and a latch unit coupled to the output terminal $t_y$ of delay cell $DCELL_y$ of the delay line, so as to latch the signal from the output terminal $t_y$ according to a trigger of a sampling pulse so as to output the digital code.

12. The analog-to-digital converting device converting device as claimed in claim 11, wherein the sampling unit comprises:
   a sampling switch, wherein a first terminal of the sampling switch receives the analog signal, a second terminal of the sampling switch is electrically connected to the voltage-current converter, so as to switch ON in a first period and switch OFF in a second period; and
   a sampling capacitor, wherein a first terminal of the sampling capacitor is electrically connected to the second terminal of the sampling switch, and a second terminal of the sampling capacitor is connected to the ground.

13. The analog-to-digital converting device as claimed in claim 11, wherein the voltage-current converter comprises:
   a first voltage-current converting cell, wherein an input terminal of the first voltage-current converting cell is electrically connected to the sampling unit, so as to decide the current value of an output terminal according to the voltage at the input terminal;
   a second voltage-current converting cell, wherein an input terminal of the second voltage-current converting cell is electrically connected to a predetermined voltage, so as to decide the current value of an output terminal according to the voltage at the input terminal;
   a current mirror, wherein a master current terminal of the current mirror is electrically connected to the output terminal of the second voltage-current converting cell, and a slave current terminal of the current mirror is electrically connected to the output terminal of the first voltage-current converting cell;
   a first transistor, wherein a source of the first transistor is electrically connected to a voltage source, a gate and a drain of the first transistor are both electrically connected to the output terminal of the first voltage-current converting cell and the delay-control terminal of the delay line, and a gate voltage of the first transistor serves as a converted result of the voltage-current converter.

14. The analog-to-digital converting device as claimed in claim 13, wherein the first voltage-current converting cell and the second voltage-current converting cell have the same circuit architecture.

15. The analog-to-digital converting device as claimed in claim 13, wherein the first voltage-current converting cell comprises:
   a current source;
   a first converting transistor, wherein a gate of the first converting transistor serves as the input terminal of the first voltage-current converting cell, a first source/drain of the first converting transistor is connected to the current source, and a second source/drain of the first converting transistor is connected to the ground;
   a second converting transistor, wherein a gate of the second converting transistor is electrically connected to the first source/drain of the first converting transistor, and a first source/drain of the second converting transistor serves as the output terminal of the first voltage-current converting cell; and
   a converting resistor, wherein a first terminal of the converting resistor is electrically connected to the second source/drain of the second converting transistor, and a second terminal of the converting resistor is connected to the ground.

16. The analog-to-digital converting device as claimed in claim 11, wherein the delay cell $DCELL_x$ further comprises:
   a P-type transistor, wherein a gate of the P-type transistor is coupled to the delay-control terminal, the first current source, and the third current source, and a source of the P-type transistor is coupled to a voltage source; and
   an N-type transistor, wherein a gate and a drain of the N-type transistor are coupled to the drain of the P-type transistor, and a source of the N-type transistor is connected to the ground;
   and in the delay cell $DCELL_x$,
   the first current source comprises:
      a fourth transistor, wherein a source of the fourth transistor is coupled to the voltage source, and a gate of the fourth transistor is electrically connected to the gate of the P-type transistor;
   the first inverter comprises:
      a fifth transistor, wherein a source of the fifth transistor is coupled to the drain of the fourth transistor, and a gate of the fifth transistor is coupled to the reset terminal;
      a sixth transistor, wherein a drain of the sixth transistor is coupled to the drain of the fifth transistor, and a gate of the sixth transistor is coupled to the output of the delay cell $DCELL_{x-1}$ of the preceding stage; and
      a seventh transistor, wherein a drain of the seventh transistor is coupled to the source of the sixth transistor, and a gate of the seventh transistor is coupled to the reset terminal;
   the second current source comprises:
      an eighth transistor, wherein a drain of the eighth transistor is coupled to the source of the seventh transistor, a gate of the eighth transistor is coupled to the gate of the N-type transistor, and a source of the eighth transistor is connected to the ground;
   the third current source comprises:
      a ninth transistor, wherein a source of the ninth transistor is coupled to the voltage source, and a gate of the ninth transistor is electrically connected to the gate of the P-type transistor;
   the second inverter comprises:
      a tenth transistor, wherein a source of the tenth transistor is coupled to the drain of the ninth transistor, a gate of the tenth transistor is coupled to the drain of the fifth transistor, and the drain of the tenth transistor is the output of the delay cell $DCELL_x$; and
      an eleventh transistor, wherein a drain of the eleventh transistor is coupled to the drain of the tenth transistor, and a gate of the eleventh transistor is coupled to the drain of the fifth transistor; and
   the fourth current source comprises:
      a twelfth transistor, wherein a drain of the twelfth transistor is coupled to the source of the eleventh transistor, a gate of the twelfth transistor is coupled to the gate of the N-type transistor, and a source of the twelfth transistor is connected to the ground.

17. The analog-to-digital converting device as claimed in claim 11, further comprising:
   a code converter electrically connected to the latch unit, for converting the digital code to a binary code.

* * * * *